Feb. 13, 1962 R. SPILLAR 3,021,498

UNIVERSAL CIRCUIT BOARD

Filed Feb. 10, 1959

INVENTOR
R. SPILLAR
BY A. C. Schwarz, Jr.
ATTORNEY 3,021,498

UNIVERSAL CIRCUIT BOARD

Rudolph Spillar, Cicero, Ill., assignor to Western Electric Company, Incorporated, New York, N.Y., a corporation of New York

Filed Feb. 10, 1959, Ser. No. 792,306
4 Claims. (Cl. 339—18)

This invention relates to a circuit assembly and the components thereof, and more particularly to an assembly of universal circuit boards comprising an insulator and conductor structure which provides a variable circuit assembly.

Where there is a need for circuitry or an electrical assembly it is necessary to interconnect electrical conductors in a variety of patterns. In doing this it is necessary to hold the wires in a given position while interconnections are made by other conductors. In the past this was done by holding the individual wires in contact with each other with a pair of pliers or by placing them in a jig while the soldering iron and solder are applied manually to the contact points thereof to form an electrical contact between intersecting wires of the resulting assembly. Successively produced asemblies of this sort will have irregularities in the circuitry thereof with corresponding reductions in strength and dependability of the circuit assembly. It is therefore extremely important to be able to provide a structure which can be automatically and accurately assembled with a high degree of dependability and versatility to provide a high quality circuit assembly wherein wires in different planes are electrically interconnected in a pre-determined circuit pattern.

It is a primary object of this invention to provide a srtucture of simple and economical construction for facilitating automatic production of a versatile circuit assembly.

Another object of this invention resides in a circuit assembly wherein a plurality of identical universal circuit structures can be used to provide a variety of given circuit assemblies having a great variety of circuit patterns.

A further object of this invention is to provide a simple circuit structure having round conductors securely embedded therein.

Still another object of this invention is to provide an assembly of electrically connected wires of different planes.

An additional object of this invention is to provide a circuit assembly having sturdy terminals extending therefrom in several directions to facilitate electrical connection with other circuit asemblies and with electrical components.

With these and other objects in view, the present invention contemplates a circuit assembly formed of a plurality of stacked insulator boards with parallel pairs of wires embedded in spaced relationship in one surface thereof. Each board has the wires thereof positioned transversely to the wires of adjacent boards. The wires of the individual boards are electrically connected with the wires of adjacent boards by conductor pins positioned in guide holes in the insulator boards and between given pairs of wires at the point of overlap of adjacent pairs of wires of the adjacent boards of the stack.

Other objects, advantages and novel aspects of the invention will become apparent upon consideration of the following detailed description, in conjunction with the accompanying drawing wherein.

Figure 1:
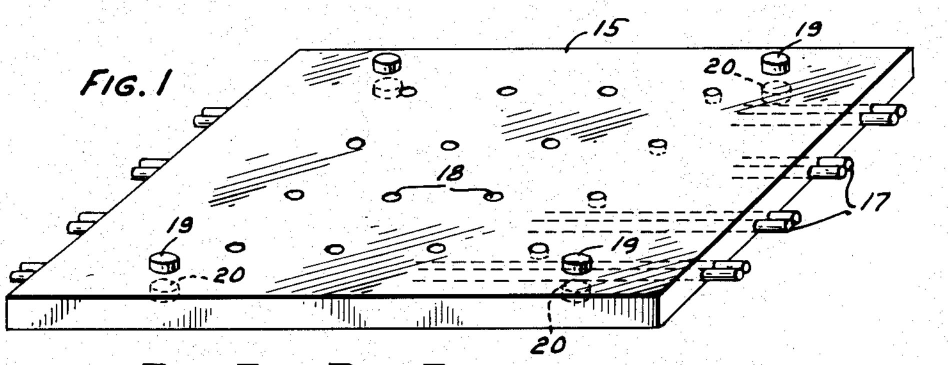
FIG. 1 is a perspective view of an insulator board showing the pairs of wires embedded therein and the pin guide openings positioned at predetermined points along respective pairs of wires.
Figures 2, 3, 4, 5:
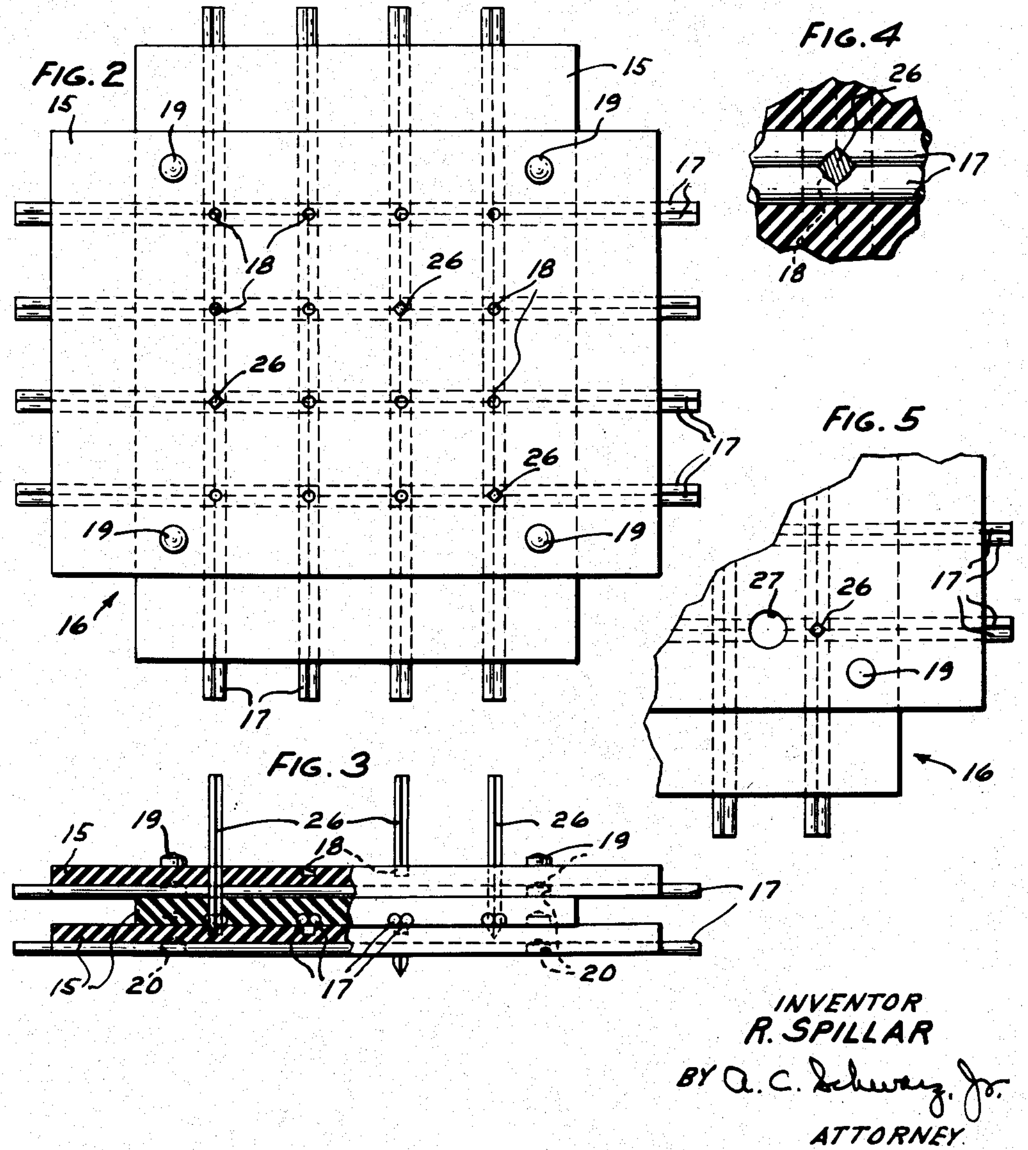
FIG. 2 is a top plan view of a plurality of stacked insulator boards forming a circuit assembly showing the alignment of the pin guide openings at the point of overlap of respective pairs of wires.
FIG. 3 is a partially sectioned front view of the circuit assembly of FIG. 2 showing the insulator boards in stacked relation with the connector pins located a predetermined distance within the aligned guide openings and between respective pairs of wires.
FIG. 4 is a fragmentary sectional view of the circuit assembly showing the relationship of a connector pin and an overlapped pair of wires.
FIG. 5 is a fragmentary top view of the circuit assembly showing a hole drilled through a pair of wires of the circuit board to limit the electrical circuitry to a predetermined pattern.

Referring to the drawings there is illustrated a universal circuit board or component 15 (FIG. 1) and a variable circuit assembly, generally designated by numeral 16 (FIGS. 2, 3 and 4). The universal circuit board 15 is made of plastic or other insulator material and is provided with pairs of wires 17 embedded in one surface of the board 15 in parallel spaced relationship. Each of the pairs of wires 17 extends beyond the edges of the respective plastic insulator board 15 in two directions. These extending ends of wires 17 facilitate electrical contact with other electrical apparatus by acting as plugs for a socket or as solder terminals for electrical components.

Each circuit board 15 has shallow guide openings 18 therein which are centered over the respective pairs of wires or conductors 17 in predetermined spaced relationship along the respective pairs of wires 17. Each of the openings 18 is shallow enough that no conductor is exposed thereby. Normally the boards 15 are oriented with the pairs of wires 17 of each of the boards 15 positioned transversely to the wires 17 of the adjacent boards 15. When the boards 15 are so oriented the respective guide openings 18 of each of the boards are in alignment at the point of overlap of the pairs of wires 17 of the respective adjacent pairs of wires 17 of adjacent insulator boards 15 to form groups of the openings 18 which are aligned. The wires 17 and openings 18 are arranged on the boards 15 so that the boards can be oriented with the wires 17 of adjacent boards 15 in parallel relation and still have the respective openings 18 of adjacent boards 15 in alignment. Registry pins 19 and corresponding openings 20 therefor are provided on respective sides of each board to maintain the guide openings 18 in alignment.

Pins 26 (FIGS. 2, 3 and 4) are forced into the individual groups of openings 18, which are aligned, and between the respective pairs of wires 17, which overlap in the path of the aligned openings, to mechanically interlock the boards 15 and electrically connect the wires 17 of the boards 15 to the wires 17 of the adjacent boards 15. The pins 26 may be rectangular in cross section and are pointed on the ends to facilitate entry through the aligned guide opening 18 and between the overlapping pairs of wires 17 in the adjacent stacked insulator boards 15. The pins 26 are solder coated so that by applying sufficient heat thereto, after being positioned within the insulator boards, the solder on the pins will flow and the pins 26 will become soldered to the wires.

Predetermined pairs of the wires 17 embedded in the plastic insulator board 15 may be severed to aid in providing a desired predetermined circuit pattern. The severing of the circuit can be done by drilling or punching a hole 27 through the board 15 (FIG. 5) at a predetermined spot to remove a segment of the wires 17 and thereby breaking the continuity thereof.

By using a number of the boards 15 with the conductors or wires 17 thereon oriented in predetermined directions and by inserting the pins 26 through a predetermined number of openings 18, of the individual groups of the openings 18 which are aligned (FIG. 3) a variety in circuitry can be provided. The pins 26 also provide sturdy terminals to which electrical components can be soldered after the pins are inserted in the openings 18 of the boards 15. The pins 26 could be part of an electrical component and thereby enable the component to be inserted directly into the circuitry to form a part thereof if desired. The pins 26 will hold the stacked boards 16 together but if a more rugged air tight assembly is desired the assembly of stacked boards 16 can be encapsulated in plastic leaving only the ends of the wires 17 and the pins 26 exposed for electrical connections.

It is to be understood that the above-described arrangements are simply illustrative of the application of the principles of this invention. Numerous other arrangements may be readily devised by those skilled in the art which will embody the principles of the invention and fall within the spirit and scope thereof.

What is claimed is:

1. An electrical unit which comprises an elongated conductive pin having a rectilinear cross section, a first insulating board, a pair of parallel conductors embedded within the first insulating board and spaced apart a distance less than the shortest distance between two non-adjacent vertices of the rectilinear cross section of the conductive pin, a second insulating board, and a pair of parallel conductors embedded within the second insulating board and spaced apart a distance equal to the spacing distance of the conductors of the first insulating board, the conductive pin being forced through the first insulating board and between the pair of conductors embedded therein, and through the second insulating board and between the pair of conductors embedded therein to electrically connect the conductors of the first insulating board to the conductors of the second insulating board and to mechanically interlock the first and second insulating boards.

2. An electrical device comprising a stack of insulating boards, each of said boards having a pair of recesses, a pair of projections extending from each board into said recesses in an adjacent board for holding said boards from lateral displacement, pairs of conductors embedded in each board, each pair of conductors in each board extending perpendicular to the pairs of conductors in adjacent boards, each board having indentations formed in the surface thereof that are centered over the intersections of the pairs of conductors, and tapered pins having rectangular cross section selectively driven through said boards at said indentations so that a pair of oppositely disposed vertices of said rectangular cross section bite into and permanently deform and grippingly engage said pairs of conductors for establishing electrical continuity between the pairs of conductors in said boards and for holding said boards against vertical displacement.

3. A universal circuit assembly comprising a plurality of stacked insulator boards, pairs of malleable conductors embedded in individual insulator boards in spaced relationship, and electrically conductive pins forced through said insulator boards and through and between said pairs of malleable conductors to plastically deform said conductors for electrically interconnecting said embedded conductors of adjacent insulator boards and mechanically interlocking said boards.

4. A universal circuit assembly comprising a plurality of stacked insulator boards, pairs of malleable conductors embedded within the insulator boards, said insulator boards having guide recesses in a predetermined pattern thereon centered over and between the pairs of conductors, means to retain said insulator boards with the respective guide recesses thereof in alignment with adjacent guide recesses of adjacent insulator boards, and electrically conductive pins forced through said recesses and insulator boards and through and between said pairs of malleable conductors to permanently deform and grippingly engage said conductors for electrically interconnecting respective conductors of adjacent insulator boards and mechanically interlocking said boards.

References Cited in the file of this patent

UNITED STATES PATENTS

| | | |
|---|---|---|
| 2,442,968 | Bierwirth | June 8, 1948 |
| 2,469,397 | Mezek | May 10, 1949 |
| 2,876,393 | Tally et al. | Mar. 3, 1959 |
| 2,883,447 | Dahl | Apr. 21, 1959 |

FOREIGN PATENTS

| | | |
|---|---|---|
| 482,563 | Germany | Sept. 18, 1929 |
| 940,415 | Germany | Mar. 15, 1956 |